(12) United States Patent
Wu et al.

(10) Patent No.: US 9,437,345 B2
(45) Date of Patent: Sep. 6, 2016

(54) METHODS FOR FABRICATING AND TREATING DOPED CONJUGATED POLYMER FILM

(75) Inventors: Chun-Guey Wu, Taoyuan County (TW); Chien-Hung Chiang, Taoyuan County (TW)

(73) Assignee: NATIONAL CENTRAL UNIVERSITY, Jhongli, Taoyuan County (TW)

( * ) Notice: Subject to any disclaimer, the term of this patent is extended or adjusted under 35 U.S.C. 154(b) by 781 days.

(21) Appl. No.: 13/490,305

(22) Filed: Jun. 6, 2012

(65) Prior Publication Data

US 2013/0105740 A1 May 2, 2013

(30) Foreign Application Priority Data

Oct. 28, 2011 (TW) .............................. 100139467 A

(51) Int. Cl.
| | |
|---|---|
| *B05D 5/12* | (2006.01) |
| *H01B 1/12* | (2006.01) |
| *C08G 61/12* | (2006.01) |
| *C08G 73/02* | (2006.01) |
| *H01L 51/00* | (2006.01) |

(52) U.S. Cl.
CPC ............. *H01B 1/127* (2013.01); *C08G 61/126* (2013.01); *C08G 73/0266* (2013.01); *H01B 1/128* (2013.01); *H01L 51/0037* (2013.01); *C08G 2261/1424* (2013.01); *C08G 2261/3223* (2013.01); *C08G 2261/3327* (2013.01); *C08G 2261/344* (2013.01); *C08G 2261/51* (2013.01); *C08G 2261/794* (2013.01)

(58) Field of Classification Search
CPC ...... H01B 1/124; H01B 1/127; H01B 1/128; B05D 5/12
See application file for complete search history.

(56) References Cited

U.S. PATENT DOCUMENTS

| | | | | |
|---|---|---|---|---|
| 6,967,236 | B1 * | 11/2005 | Angelopoulos et al. ...... | 528/491 |
| 2011/0190461 | A1 * | 8/2011 | Kita ..................... | C07D 495/04 |
| | | | | 526/256 |
| 2012/0135255 | A1 * | 5/2012 | Onodera et al. .............. | 428/500 |

FOREIGN PATENT DOCUMENTS

| | | |
|---|---|---|
| CN | 101070420 A | 11/2007 |
| JP | 2000-516023 A | 11/2000 |
| JP | 2006131873 A | 5/2006 |
| JP | 2008248011 | 10/2008 |
| JP | 2010047671 A | 3/2010 |
| TW | I325007 B | 5/2010 |

(Continued)

*Primary Examiner* — Brian P Mruk
(74) *Attorney, Agent, or Firm* — Muncy, Geissler, Olds & Lowe, P.C.

(57) ABSTRACT

A method for fabricating a doped conjugated polymer film includes the steps of: mixing a polar substance, a polar solvent and a doped conjugated polymer to form a doped conjugated polymer solution, and forming a conjugated polymer film with the doped conjugated polymer solution. In addition, a method for treating a doped conjugated polymer film includes the steps of: providing a doped conjugated polymer film, and adding a mixed solution which contains a polar substance and a polar solvent to the doped conjugated polymer film. In these cases, the polar substance is selected from the group consisting of formula (1), formula (2), inorganic acids, benzene-containing organic acids, or their combinations. The polar solvent is selected from the group consisting of water, ethers, alcohols, sulfoxides, alcohol ethers, ketones, amines, nitriles, carboxylic acids, amides, or their combinations.

6 Claims, 2 Drawing Sheets

(56) References Cited

FOREIGN PATENT DOCUMENTS

| TW | 201038668 A | 11/2010 |
| TW | 201105726 A | 2/2011 |
| TW | 201127868 A | 8/2011 |
| WO | WO 2010/143450 A1 | 12/2010 |

* cited by examiner

METHODS FOR FABRICATING AND TREATING DOPED CONJUGATED POLYMER FILM

CROSS REFERENCE TO RELATED APPLICATIONS

This Non-provisional application claims priority under 35 U.S.C. §119(a) on Patent Application No(s). 100139467 filed in Taiwan, Republic of China on Oct. 28, 2011, the entire contents of which are hereby incorporated by reference.

BACKGROUND OF THE INVENTION

1. Field of Invention

The present invention relates to a method for fabricating a high conductive conjugated polymer 0lin and its application, and in particular, to the methods for fabricating and treating a doped conjugated polymer film to improve its conductivity and thermal stability.

2. Related Art

Conjugated polymers are the materials with the properties of both classic organic polymer and conductor/semiconductor. Furthermore, their electric properties, such as conducting and insulation can be changed reversibly via redox doping or adding acid/base agent. Accordingly, the conductive conjugated polymer film can be applied to the fields of solar cell, capacitor, light-emitting diode, chemical sensor, pattern etching, anti-corrosion, electrode material, EMI shielding, electro-chromic display, ElectroStatic Discharge (ESD) and the likes. In general, the commonly used conjugated polymers include polyacetylenes, polypyrroles, polyparaphenylenes, polythiophenes, polyfurans, polythianaphthenes, polyanilines (PANI), and their derivations or copolymers. In order to fabricate the conductive conjugated polymer film, the conventional method is usually to dissolve the conjugated polymer in the solvent (e.g. water or organic solvent) to form a conjugated polymer solution for the following film fabrication.

However, doped conjugated polymers are generally not solubable in common solvents. In order to increase the solubility of the doped conjugated polymers, the conventional method is to modify the structure of the conjugated polymer or use the counter anions with higher solubility. Unfortunately, these methods usually result in the worse conductivity of the fabricated conjugated polymer film. Furthermore, since the doped conjugated polymer contains dopants, its thermal stability is poor due to the loss of dopants. Nevertheless, high conductivity and high thermal stability of the conjugated polymer film are necessary for various applications e.g. electrode.

Therefore, it is an important subject of the present invention to improve the conductivity and thermal stability of the conjugated polymer film.

SUMMARY OF THE INVENTION

In view of the foregoing subject, an objective of the present invention is to provide a method for fabricating a conjugated polymer film with enhanced conductivity and thermal stability.

To achieve the above objective, the present invention discloses a method for fabricating a doped conjugated polymer film. The method includes the steps of: mixing a polar substance, a polar solvent and a doped conjugated polymer to form a doped conjugated polymer solution; and fabricating the doped conjugated polymer film with the doped conjugated polymer solution. Herein, the polar substance is selected from the group consisting of formula (1), formula (2), inorganic acids, benzene-containing organic acids, or their combinations, and the polar solvent is selected from the group consisting of water, ethers, alcohols, sulfoxides, alcohol ethers, ketones, amines, nitriles, carboxylic acids, amides, or their combinations.

(1)

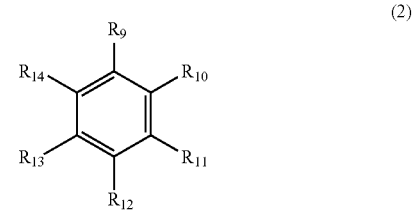

(2)

In one embodiment of the present invention, the doped conjugated polymer is selected from the group consisting of formulas (3) to (6), or their derivatives, copolymers, or combinations.

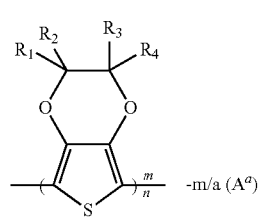

(3)

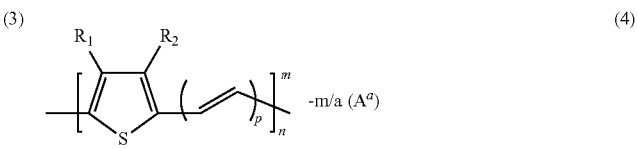

(4)

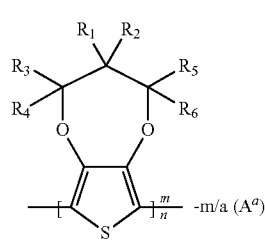

(5)

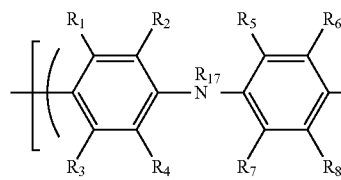 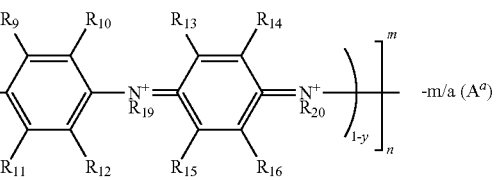 (6)

In one embodiment of the present invention, the mixing step is to mix the polar solvent and the doped conjugated polymer, and then to add the polar substance.

In one embodiment of the present invention, the concentration of the doped conjugated polymer is between 0.1 and 30 weight %.

In one embodiment of the present invention, the concentration of the polar substance is between 0.001 and 50 weight %.

In one embodiment of the present invention, n of the formulas (3) to (6) is an integral between 3 and 5000, each of $R_1$ to $R_{20}$ of the formulas (3) to (6) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, j is an integral between 0 and 8, p of the formula (4) is an integral between 0 and 3, y of the formula (6) is integral real number between 0 and 1, m of the formulas (3) to (6) is an integral between −5000 and 5000, a of the formulas (3) to (6) is an integral between 5000 and −5000, and $A^a$ of the formulas (3) to (6) is an organic cation, an organic anion, an inorganic cation, an inorganic anion, or an ionic polymer.

In one embodiment of the present invention, e of the formula (1) is an integral between 0 and 5, each of $R_1$ to $R_8$ of the formula (1) and $R_9$ to $R_{14}$ of the formula (2) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, and j is an integral between 0 and 8.

In one embodiment of the present invention, at least one of $R_1$ to $R_8$ of the formula (1) or $R_9$ to $R_{14}$ of the formula (2) comprises at least one halogen.

In one embodiment of the present invention, the polar substance is selected from the group consisting of hexafluoroisopropanol, 1,1,1,3,3,3-hexafluoro-2-phenyl-2-propanol, 1,1,1,3,3,3-hexafluoro-2-(p-tolyl)-propanol, heptafluoroisopropyl iodide, tetrafluoropropanol, pentafluoropropanol, hexafluoropropanol, 1H,1H,3H-hexafluoro-2-butanol, nonafluorovaleric acid, perfluorohexenoic acid, hexafluoro benzene, perfluoropropane, sulfuric acid, hydrochloric acid, perchloric acid, nitric acid, benzoic acid, and their combinations.

In one embodiment of the present invention, the polar solvent is selected from the group consisting of: water, ethyl ether, ethyl propyl ether, propyl ether, diisopropyl ether, dibutyl ether, methyl tert-butyl ether, ethylene glycol dimethyl ether, diethylene glycol dimethyl ether, benzyl methyl ether, isochroman, 2-phenylethylmethyl ether, n-butyl ethyl ether, 1,2-diethoxyethane, sec-butyl ether, isodibutyl ether, ethyl n-propyl ether, ethyl isopropyl ether, n-hexyl methyl ether, n-butyl methyl ether, methyl n-propyl ether, methanol, ethanol, ethylene glycol, 1-propanol, 2-propanol (isopropanol), glycerol, 1-butanol, 2-butanol, 2-methyl-1-propanol (isobutanol), 2-methyl-2-propanol (tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 3-hexanol, 2-hexanol, 4-methyl-2-pentanol, 2-methyl-1-butanol, 2,2-dimethyl-1-propanol, 3-hexanol, 2-hexanol, 4-methyl-2-pentanol, 2-methyl-1-pentanol, 2-ethyl butanol, 2,4-dimethyl-3-pentanol, 1-heptanol, 2-heptanol, 3-heptanol, 4-heptanol, 2-ethyl-1-hexanol, 2,6-dimethyl-4-heptanol, 2-dimethyl cyclohexanol, 3-dimethyl cyclohexanol, 4-dimethyl cyclohexanol, 2-butoxyethanol, 1-methoxy-2-propanol, 2-methoxyethanol, 2-ethoxyethanol, 1-methoxy-2-butanol, ethylene glycol monopropyl ether, 1-ethoxy-2-propanol, 3-methoxy-1-butanol, ethylene glycol monoisobutyl ether, ethylene glycol mono-n-butyl ether, 3-methoxy-3-methyl butanol, ethylene glycol mono-tert-butyl ether, acetone, methyl ethyl ketone, methyl isobutyl ketone, cyclohexanone, isopropyl ketone, 2-pentanone, 3-pentanone, 3-hexanone, diisopropanone, 2-dihexanone, cyclopentanone, 4-heptanone, isoamyl ketone, 3-heptanone, 2-heptanone, 4-methoxy-4-methyl-2-pentanone, 5-methyl-3-heptanone, 2-methyl cyclohexanone, diisobutyl ketone, 5-methyl-2-octanone, 3-methyl cyclohexanone, 2-cyclohexene-1-one, 4-methyl cyclohexanone, cycloheptanone, 4-ten-butyl cyclohexanone, isophorone, benzylacetone, acetonitrile, acrylonitrile, trichloroacetonitrile, propionitrile, neo-pentanenitrile, isobutyronitrile, n-butyronitrile, methoxyacetonitrile, 2-methylbutyronitrile, isopentanenitrile, n-pentanenitrile, n-hexanenitrile, 3-methoxypropionitrile, 3-ethoxypropionitrile, 3,3-oxydipropionitrile, n-heptanenitrile, glycolonitrile, benzonitrile, ethylene cyanohydrin, butanedinitrile, acetone cyanohydrin, 3-n-butoxypropionitrile, dimethyl sulfoxide, dibutyl sulfoxide, methyl phenyl sulfoxide, dimethylformamide, dimethylacetamide, acrylamide, 2-acetamidoethanol, N,N-dimethyl-n-benzylformamide, trifluoroacetamide, N,N-dimethylformamide, N,N-diethyl lauroylamide, ε-caprolactam, N,N-dimethyl ethylamide, N-tert-butylformamide, formamide, neo-pentanamide, N-butyramide, N,N-dimethylacetylacetamide, N-methylformamide, N,N-diethylformamide, N-carbonylethylamine, acetamine, N,N-diisopropylformamine, 1-formylpiperidine, N-methyl-N-formylaniline, monoalkylamine, dialkylamine, trialkylamine, cycloamine, aromatic amine, $C_6$ carboxylic acid, and their combinations.

The present invention also discloses a method for treating a doped conjugated polymer film. The method includes the steps of: providing the doped conjugated polymer film; and adding a mixed solution to the doped conjugated polymer film, wherein the mixed solution contains a polar substance and a polar solvent, the polar substance is selected from the group consisting of formula (1), formula (2), inorganic acids, benzene-containing organic acids, or their combinations, and the polar solvent is selected from the group consisting of water, ethers, alcohols, sulfoxides, alcohol ethers, ketones, amines, nitriles, carboxylic acids, amides, or their combinations.

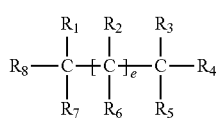
(1)

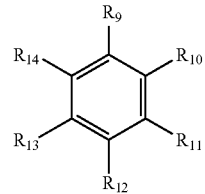
(2)

In one embodiment of the present invention, the doped conjugated polymer contained in the doped conjugated polymer film is selected from the group consisting of formulas (3) to (6), or their derivatives, copolymers, or combinations.

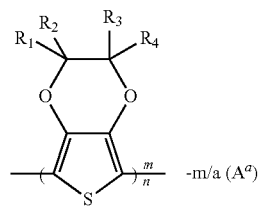
(3)

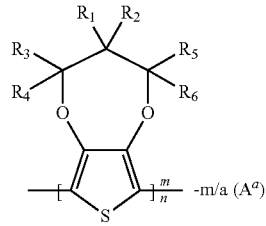
(5)

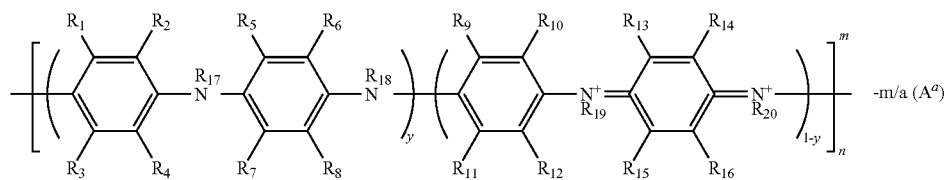
(6)

In one embodiment of the present invention, the concentration of the polar substance in the mixed solution is between 0.001 and 50 weight %.

In one embodiment of the present invention, the mixed solution is in a liquid or vapor state for adding to the doped conjugated polymer film by coating, spreading, injecting, or dipping.

As mentioned above, the method for fabricating a doped conjugated polymer film is to mix the doped conjugated polymer and polar substance in polar solvent, so as to form the doped conjugated polymer film with lower sheet resistance, higher conductivity and thermal stability. In addition, the method for treating a doped conjugated polymer film of the present invention is to add a mixed solution to the doped conjugated polymer film for efficiently enhancing the conductivity of the doped conjugated polymer film. The resulting doped conjugated polymer film can be applied to the fields of solar cell, capacitor, light-emitting diode, pattern etching, ESD, flexible electrode, EMI shielding, and the likes.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

Figure 1:
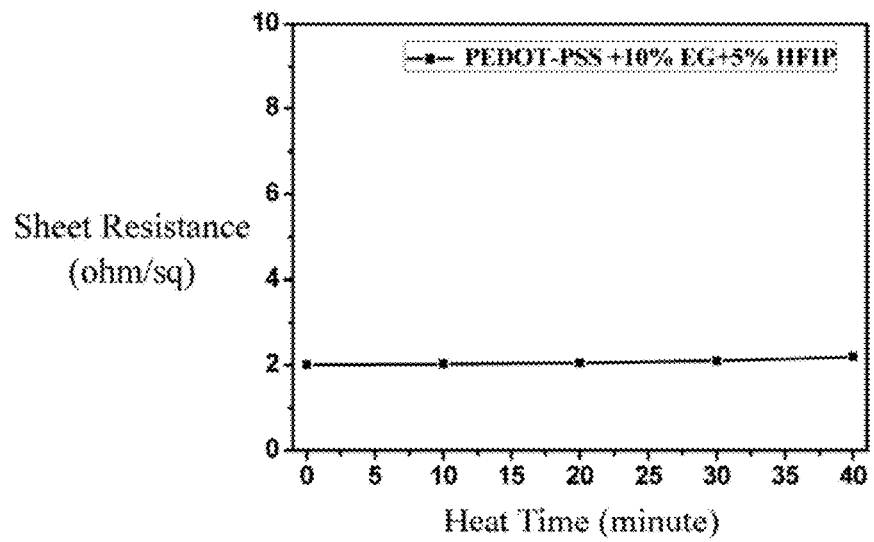
FIG. 1 is a graph showing the thermal stability test result of the sheet resistance of a doped conjugated polymer film fabricated by mixing PEDOT:PSS, water, ethylene glycol and hexafluoroisopropanol.

The present invention will be apparent from the following detailed description, which proceeds with reference to the accompanying drawings, wherein the same references relate to the same elements.

Firstly, the method for fabricating a doped conjugated polymer film according to the present invention will be described. The fabricating method includes the following steps of: mixing a polar substance, a polar solvent and a doped conjugated polymer to form a doped conjugated polymer solution; and forming the doped conjugated polymer film with the doped conjugated polymer solution.

The polar substance is selected from the group consisting of formula (1), formula (2), inorganic acids, benzene-containing organic acids, or their combinations.

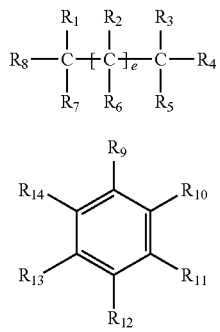

Herein, e of the formula (1) is an integral between 0 and 5, each of $R_1$ to $R_8$ of the formula (1) and $R_9$ to $R_{14}$ of the formula (2) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, and j is an integral between 0 and 8. In one embodiment of the present invention, the polar substance comprises hexafluoroisopropanol (HFIP), 1,1,1,3,3,3-hexafluoro-2-phenyl-2-propanol (HFPP), 1,1,1,3,3,3-hexafluoro-2-(p-tolyl)-propanol (HFTP), heptafluoroisopropyl iodide, tetrafluoropropanol (TFP), pentafluoropropanol (PFPOH), hexafluoropropanol, 1H,1H,3H-hexafluoro-2-butanol, nonafluorovaleric acid, perfluorohexenoic acid, hexafluoro benzene, perfluoropropane (PFP), sulfuric acid, hydrochloric acid, perchloric acid, nitric acid, benzoic acid, and their combinations. In another embodiment of the present invention, at least one of $R_1$ to $R_8$ of the formula (1) or $R_9$ to $R_{14}$ of the formula (2) comprises at least one halogen. Herein, halogen includes fluorine, chlorine, bromine or iodine. For example, $R_1$ may be a halogenated alkyl substituted by at least one halogen, such as —$CHF_2$, —$CH_2F$, —$C_2H_2F_3$, or the likes. Of course, $R_1$ to $R_{14}$ of the present invention is not limited to alkyl substituted by at least one halogen, and they may be alkylene substituted by at least one halogen, such as —$CHCF_2$, —$CCF$, or any other substituted group having at least one substituted position.

The polar solvent is selected from the group consisting of: water, ethers (e.g. ethyl ether, ethyl propyl ether, propyl ether, diisopropyl ether, dibutyl ether, methyl tert-butyl ether, ethylene glycol dimethyl ether, diethylene glycol dimethyl ether, benzyl methyl ether, isochroman, 2-phenylethylmethyl ether, n-butyl ethyl ether, 1,2-diethoxyethane, sec-butyl ether, isodibutyl ether, ethyl n-propyl ether, ethyl isopropyl ether, n-hexyl methyl ether, n-butyl methyl ether, methyl n-propyl ether, or the likes), alcohols (e.g. methanol, ethanol, ethylene glycol, 1-propanol, 2-propanol (isopropanol), glycerol, 1-butanol, 2-butanol, 2-methyl-1-propanol (isobutanol), 2-methyl-2-propanol (tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 3-hexanol, 2-hexanol, 4-methyl-2-pentanol, 2-methyl-1-butanol, 2,2-dimethyl-1-propanol, 3-hexanol, 2-hexanol, 4-methyl-2-pentanol, 2-methyl-1-pentanol, 2-ethyl butanol, 2,4-dimethyl-3-pentanol, 1-heptanol, 2-heptanol, 3-heptanol, 4-heptanol, 2-ethyl-1-hexanol, 2,6-dimethyl-4-heptanol, 2-dimethyl cyclohexanol, 3-dimethyl cyclohexanol, 4-dimethyl cyclohexanol, or their combinations), sulfoxides (e.g. dimethyl sulfoxide, dibutyl sulfoxide, methyl phenyl sulfoxide, or their combinations), alcohol ethers (e.g. 2-butoxyethanol, 1-methoxy-2-propanol, 2-methoxyethanol, 2-ethoxyethanol, 1-methoxy-2-butanol, ethylene glycol monopropyl ether, 1-ethoxy-2-propanol, 3-methoxy-1-butanol, ethylene glycol monoisobutyl ether, ethylene glycol mono-n-butyl ether, 3-methoxy-3-methyl butanol, ethylene glycol mono-tert-butyl ether, or their combinations), ketones (e.g. acetone, methyl ethyl ketone, methyl isobutyl ketone, cyclohexanone, isopropyl ketone, 2-pentanone, 3-pentanone, 3-hexanone, diisopropanone, 2-dihexanone, cyclopentanone, 4-heptanone, isoamyl ketone, 3-heptanone, 2-heptanone, 4-methoxy-4-methyl-2-pentanone, 5-methyl-3-heptanone, 2-methyl cyclohexanone, diisobutyl ketone, 5-methyl-2-octanone, 3-methyl cyclohexanone, 2-cyclohexene-1-one, 4-methyl cyclohexanone, cycloheptanone, 4-tert-butyl cyclohexanone, isophorone, benzylacetone, or their combinations), amines (e.g. monoalkylamine, dialkylamine, trialkylamine, cycloamine, aromatic amine, or their combinations), nitriles (e.g. acetonitrile, acrylonitrile, trichloroacetonitrile, propionitrile, neo-pentanenitrile, isobutyronitrile, n-butyronitrile, methoxyacetonitrile, 2-methylbutyronitrile, isopentanenitrile, n-pentanenitrile, n-hexanenitrile, 3-methoxypropionitrile, 3-ethoxypropionitrile, 3,3-oxydipropionitrile, n-heptanenitrile, glycolonitrile, benzonitrile, ethylene cyanohydrin, butanedinitrile, acetone cyanohydrin, 3-n-butoxypropionitrile, or their combinations), carboxylic acids (e.g. $C_1$ to $C_6$ linear or nonlinear carboxylic acids), or amides (e.g. dimethylformamide, dimethylacetamide, acrylamide, 2-acetamidoethanol, N,N-dimethyl-n-benzylformamide, trifluoroacetamide, N,N-dimethylformamide, N,N-diethyl lauroylamide, ϵ-caprolactam, N,N-dimethyl ethylamide, N-ten-butylformamide, formamide, neo-pentanamide, N-butyramide, N,N-dimethylacetylacetamide, N-methylformamide, N,N-diethylformamide, N-carbonylethylamine, acetamine, N,N-diisopropylformamine, 1-formylpiperidine, N-methyl-N-formylaniline, or their combinations).

The conjugated polymer herein indicates a polymer consisting of one backbone chain of alternating single bonds and double bonds, which has inherent conductivity, so it also called an intrinsic conductive polymer (ICP). The conjugated polymer of this invention is preferably selected from the group consisting of poly(3,4-ethylenedioxythiophenes) (PEDOT), polythiophenes, poly(3,4-(2,2-benzylpropylenedioxythiophenes) (PPropOT), polyanilines (PANT), or their copolymers, derivations, or combinations. In order to enhance the conductivity of the conjugated polymer, an embodiment of the present invention is to utilizing a means of doping for forming charge carriers (holes or electrons) in a doped conjugated polymer to enhance the conductivity. Doping can be performed by using an acid solution or an oxidant. To be noted, the doping step of this invention may add the dopant to the monomers before polymerization, or to the prepared conjugated polymers. The added dopant may include one or more kinds of dopant materials, and the conjugated polymers may be repeatedly treated by doping and dedoping steps according to the requirements. Above all, the conjugated polymers for mixing with the polar substance and polar solvent in the following step are preferably doped conjugated polymers.

The doped conjugated polymer of the present invention is preferably selected from the group consisting of formulas (3) to (6), or their derivatives, copolymers (e.g. formulas (7) and (8)), or combinations.

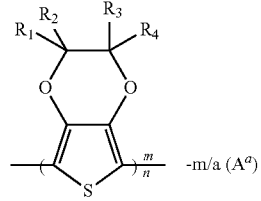

(3)

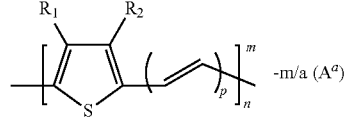

(4)

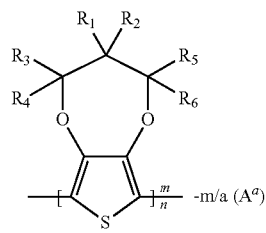

(5)

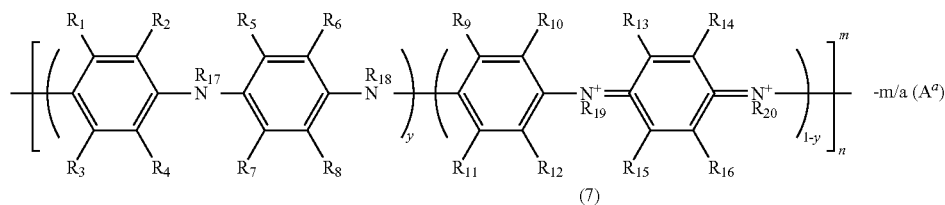

(6)

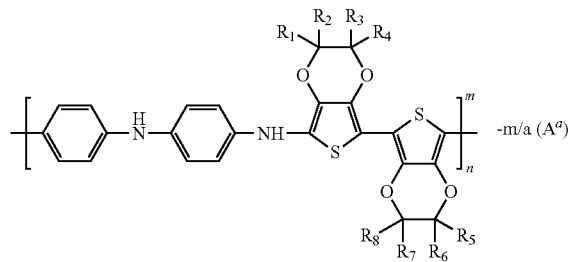

(7)

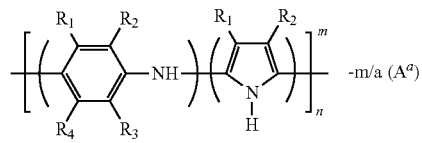

(8)

Regarding to the above formulas (3) to (8). Formula (3) shows the structure of a doped PEDOT and its derivations. Formula (4) shows the structure of a doped polythiophene and its derivations. Formula (5) shows the structure of a doped PPropOT and its derivations. Formula (6) shows the structure of a doped PANI and its derivations. Formula (7) shows the structure of a doped poly(aniline-co-3,4-ethylene-dioxy-thiophene) and its derivations, which are mostly the copolymers composed of aniline and EDOT. Formula (8) shows the structure of a doped poly(aniline-co-pyrrole) and its derivations, which are mostly the copolymers composed of aniline and pyrrole.

Herein, n of the formulas (3) to (8) is an integral between 3 and 5000, each of $R_1$ to $R_{20}$ of the formulas (3) to (8) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, and j is an integral between 0 and 8. In addition, p of the formula (4) is an integral between 0 and 3, y of the formula (6) is an a real number between 0 and 1, m of the formulas (3) to (8) is an integral between −5000 and 5000, a of the formulas (3) to (8) is an integral between −5000 and 5000, and $A^a$ of the formulas (3) to (8) is an organic cation (e.g. $CSA^{-1}$ (camphorsulfonic acid), $MSA^{-1}$ (methylsulfonic acid), $TsO^{-1}$ (toluene-p-sulfonic acid), $DBSA^{-1}$ (dodecylbenzene-sulfonic acid) or formula (9)), an organic anion (e.g. N-alkylpyridinium ($[CnPY]^+$)), an ionic polymer (e.g. formula (10) or formula (11)), an inorganic anion (e.g. $F^{-1}$, $Br^{-1}$, $Cl^{-1}$, $I^{-1}$, $SO_4^{-2}$, $PO_4^{-3}$, $ClO_4^{-1}$, $ClO_2^{-1}$, $BF_4^{-1}$, $NO_3^{-1}$ or the likes), or an inorganic cation (e.g. $NH_4^+$, $Na^+$, $K^+$ or the likes). Herein, q of the formulas (10) and (11) is an integral between 1 and 5000. To be noted, in the above definitions, "between" intends to include the two end points.

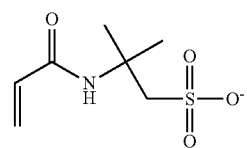

(9)

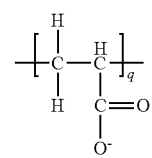

(10)

-continued

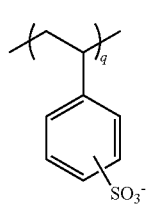

(11)

In the step of mixing the polar substance, polar solvent and doped conjugated polymer to form a doped conjugated polymer solution, the doped conjugated polymer can be a powder or a lump, or in a solution state to mix with the polar substance and polar solvent. Alternatively, the doped conjugated polymer may be mixed with the polar solvent in advance, and then added with the polar substance. The concentration of the doped conjugated polymer is between 0.1 and 30 weight %, and the concentration of the polar substance is between 0.001 and 50 weight %.

In the step of mixing the polar substance, polar solvent and doped conjugated polymer, it is preferred to add each material in a certain order based on their polarities. For example, in one embodiment of the present invention, the selected polar substance has a polarity larger than that of the polar solvent. Thus, when mixing the polar substance, polar solvent and doped conjugated polymer, the polar solvent and doped conjugated polymer with relatively smaller polarities are mixed in advance, and then the polar substance with larger polarity is added. This method can prevent the non-compatible issue between the high polarity polar substance and the low polar doped conjugated polymer, which may form precipitation in the polymer solution. However, in other embodiments, the selected polar substance and polar solvent have the same or similar polarities, so that both of them can be mixed with the doped conjugated polymer at the same time. In another case, the polar substance and polar solvent may be well mixed in advance, and then the mixture is added to the doped conjugated polymer. In another embodiment, the selected polar substance has a polarity smaller than that of the selected polar solvent. Thus, in the mixing step, the polar substance and doped conjugated polymer are mixed in advance, and then the polar solvent is added. This invention is not to limit the order of the materials added in the mixing step.

After the polar substance, polar solvent and doped conjugated polymer are well mixed, the mixed solution is used to form a doped conjugated polymer film with high conductivity and high thermal stability by spin coating, spreading, flow coating, molding, dip plating or the likes. The fabricated doped conjugated polymer film can be applied to the fields of solar cell, capacitor, electrode of LED, conductive pattern formation, anti-static, flexible electrode, or EMI shielding. In one embodiment of the present invention, the doped conjugated polymer film fabricated from the solution containing the polar substance and polar solvent has lower sheet resistance (200 times lower) and thermal stability compared to the film fabricated from doped conjugated polymer aqueous solution (only use water as the solvent for dissolving the doped conjugated polymers).

In addition, the present invention also discloses a method for treating a doped conjugated polymer film, which includes the steps of providing the doped conjugated polymer film; and adding a mixed solution to the doped conjugated polymer film.

The doped conjugated polymer film is composed of a doped conjugated polymer, which is selected from the group consisting of formulas (3) to (6), or their derivatives, copolymers, or combinations. The selected doped conjugated polymer can be referred to the previous embodiment and descriptions.

The mixed solution is composed of a polar substance and a polar solvent. Herein, the polar substance is selected from the group consisting of formula (1), formula (2), or inorganic acids (e.g. sulfuric acid, hydrochloric acid, perchloric acid, or nitric acid), benzene-containing organic acid (e.g. benzoic acid), and their combinations. The polar solvent is selected from the group consisting of water, ethers, alcohols, sulfoxides, alcohol ethers, ketones, amines, nitriles, carboxylic acids, amides, or their combinations. The selected polar substance and polar solvent can be referred to the previous embodiment and descriptions.

Different from the fabricating method of the previous embodiment, the method for treating the doped conjugated polymer film is to use the mixed solution for treating the doped conjugated polymer film after the doped conjugated polymer film has been fabricated. In addition, the polar substance in the mixed solution is about 0.001 to 50 weight %.

The mixed solution can be "added" to the doped conjugated polymer film by any means that allows the mixed solution to contact with the doped conjugated polymer film. For example, the mixed solution is in the liquid or vapor state and then dropped or spread on the doped conjugated polymer film. Alternatively, the doped conjugated polymer film can be dipped into the mixed solution and then dried. In one embodiment, after testing, it is found that the doped conjugated polymer film treated by the above method also has improved conductivity.

The following examples relate to the fabrications and treatments of a PEDOT:PSS film and a PANI:PSS film for illustrating the methods for fabricating and treating a doped conjugated polymer film according to the invention. The measuring results of the following examples show that the invention can enhance the conductivity of the doped conjugated polymer film, and the related applications are disclosed.

EXAMPLE 1

Fabrication of PEDOT:PSS Film and its Conductivity, Thermal Stability and Bending Test Fabrication of PEDOT:PSS Film PEDOT:PSS (Poly(Styrenesulfonate, Formula (12)) (0.1 g) was Dissolved in water (10 mL) to form a PEDOT:PSS aqueous solution (1 wt %). Herein, PSS is used as the dopant in the PEDOT, and the weight ratio of PEDOT:PSS is 1:2.5. Different amounts of HFIP (5 wt %, 10 wt %, 15 wt %, and 20 wt % with respect to the PEDOT:PSS aqueous solution) were added to PEDOT:PSS aqueous solution, followed by sonication for 1 hr. 100 μl samples of the pure PEDOT:PSS aqueous solution and PEDOT:PSS aqueous solutions with 4 different concentrations of HFIP were transferred to five glass plates (1×1 cm$^2$), heated to 100° C. and dried. The sheet resistances of these five samples are listed in table 1 (No. 1-5). The results show that the PEDOT:PSS film fabricated from the mixture of PEDOT:PSS, HFIP (polar substance) and water (polar solvent) has lower sheet resistance than the PEDOT:PSS film formed from pure PEDOT:PSS aqueous solution.

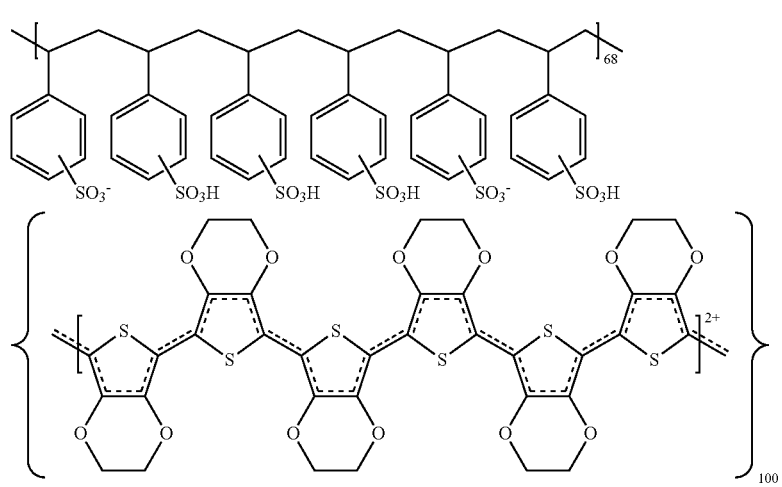

In addition, this example also uses different concentrations of PFIPI, H$_2$SO$_4$ or benzoic acid as the polar substances and uses water as the polar solvent to prepare 1 wt % PEDOT:PSS solutions, and the sheet resistances of the PEDOT:PSS films fabricated from these PEDOT:PSS solutions are also shown in table 1 (No. 6-16). The results show that the PEDOT:PSS films fabricated from the mixtures of PEDOT:PSS with PFIPI, H$_2$SO$_4$ or benzoic acid (polar substance) and water (polar solvent) have lower sheet resistances than the PEDOT:PSS film formed from pure PEDOT:PSS aqueous solution.

In addition, this example also uses HFIP as the polar substance and uses water and ethylene glycols (EG) of different concentrations as the polar solvents to prepare PEDOT:PSS solution. In this example, PEDOT:PSS can be simultaneously mixed with water, EG and HFIP, or be mixed with water in advance and then sequentially added EG and HFIP. The sheet resistances of the PEDOT:PSS films fabricated from these PEDOT:PSS solutions are also displayed in table 1 (No. 17-20). The results show that, compared with no. 1 datum, PEDOT:PSS films formed by adding the polar substance and two polar solvents have lower sheet resistances. In particular, the doped PEDOT:PSS films formed by using 10-20 wt % HFIP, 0.5-1 wt % H$_2$SO$_4$, or 0.2-4 wt % benzoic acid as the polar substance and water as the polar solvent, or using 5 wt % HFIP as the polar solvent and 10 wt % EG and 85 wt % water as the polar solvents have lower sheet resistances.

TABLE 1

| No. | PEDOT:PSS | polar substance | polar solvent | sheet resistance (ohm/sq) |
|---|---|---|---|---|
| 1 | 1 wt % | — | 99 wt % water | 439 |
| 2 | 1 wt % | 5 wt % HFIP | 94 wt % water | 135 |
| 3 | 1 wt % | 10 wt % HFIP | 89 wt % water | 14 |
| 4 | 1 wt % | 15 wt % HFIP | 84 wt % water | 3.5 |
| 5 | 1 wt % | 20 wt % HFIP | 79 wt % water | 2.8 |
| 6 | 1 wt % | 5 wt % PFIPI | 94 wt % water | 190 |
| 7 | 1 wt % | 10 wt % PFIPI | 89 wt % water | 56 |
| 8 | 1 wt % | 15 wt % PFIPI | 84 wt % water | 50 |
| 9 | 1 wt % | 20 wt % PFIPI | 79 wt % water | 45 |
| 10 | 1 wt % | 0.01 wt % H$_2$SO$_4$ | 98.99 wt % water | 200 |
| 11 | 1 wt % | 0.1 wt % H$_2$SO$_4$ | 98.9 wt % water | 74 |
| 12 | 1 wt % | 0.5 wt % H$_2$SO$_4$ | 98.5 wt % water | 4.1 |
| 13 | 1 wt % | 1 wt % H$_2$SO$_4$ | 98 wt % water | 1.79 |
| 14 | 1 wt % | 0.1 wt % benzoic acid | 98.9 wt % water | 16.93 |
| 15 | 1 wt % | 0.2 wt % benzoic acid | 98.8 wt % water | 14.64 |
| 16 | 1 wt % | 4 wt % benzoic acid | 95 wt % water | 3.71 |
| 17 | 1 wt % | 5 wt % HFIP | 89 wt % water + 5 wt % EG | 3.01 |
| 18 | 1 wt % | 5 wt % HFIP | 84 wt % water + 10 wt % EG | 1.81 |
| 19 | 1 wt % | 5 wt % HFIP | 79 wt % water + 15 wt % EG | 2.01 |
| 20 | 1 wt % | 5 wt % HFIP | 74 wt % water + 20 wt % EG | 2.01 |

Thermal Stability Test of PEDOT:PSS Film 1 wt % PEDOT:PSS, 84 wt % water, 10 wt % EG, and 5 wt % HFIP (No. 18 of table 1) were well mixed. A drop of PEDOT:PSS solution was put on a glass plate to form a PEDOT:PSS film and then heated to 250° C. The resistance of the PEDOT:PSS film vs. heating time was recorded as shown in FIG. 1. According to the result, the sheet resistance of the doped conjugated polymer film formed by the method of the present invention did not increase after heating the film to 250° C. for 40 minutes, suggesting the PEDOT:PSS film has good thermal stability.

Figure 2:
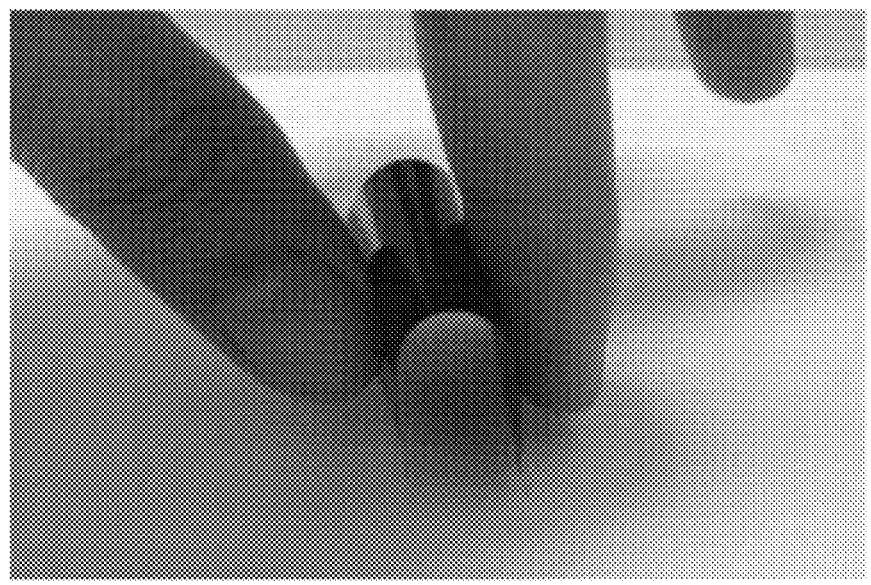
FIG. 2 is a schematic illustration showing a bending test for a doped conjugated polymer film fabricated by mixing PEDOT:PSS, water, ethylene glycol and hexafluoroisopropanol.
Figure 3:
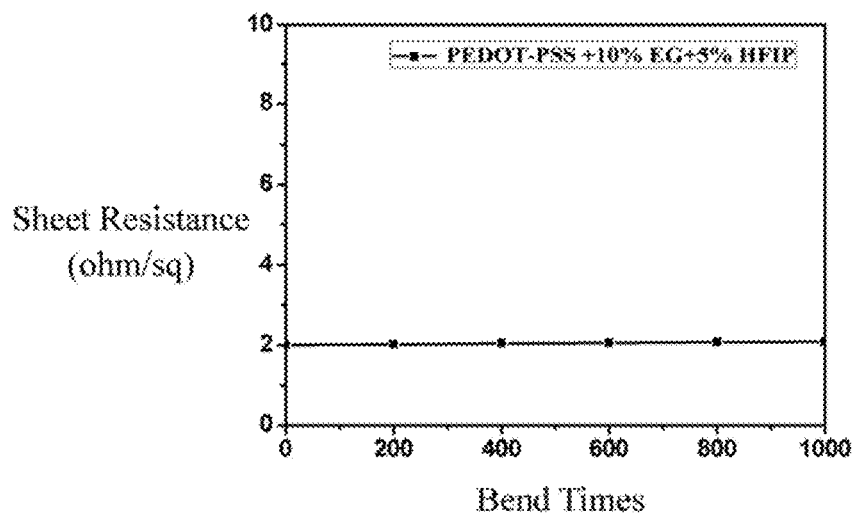
FIG. 3 is a graph showing the test result of the sheet resistance of the PEDOT:PSS film, which is bent for several times as shown in FIG. 2.

Bending test of PEDOT:PSS film 1 mL of the above solution (PEDOT:PSS solution of No. 18 of table 1) was dropped on a clean PET plastic carrier (5 cm×3 cm), heated at 100° C. to form a conductive film. As shown in FIG. 2, this film can be bended without changing its resistance. FIG. 3, shows the sheet resistance of doped PEDOT:PSS film vs. bending times. The data show that the doped conjugated polymer film with high conductivity and high stability fabricated by the method of the present invention has a similar sheet resistance after being bent for 1000 times. As a result, the conductivity and thermal stability of the doped conjugated polymer film fabricated by the method of the present invention has good flexibility, and it is suitable for the application in the flexible electrode.

EXAMPLE 2

Treating PANI:PSS Film by Mixed Solution

Fabrication of PANI:PSS Film $(NH_4)_2S_2O_8$ (0.41 g) was dissolved in 1.2M $HCl_{(aq)}$ solution (10 mL), aniline monomer (0.17 g) and phenol (1.7×g) were dissolved in 1.2M $HCl_{(aq)}$ solution (26 mL). The $HCl_{(aq)}$ $(NH_4)_2S_2O_8$ containing solution and aniline monomer containing solution were mixed to perform the polymerization in room temperature. After reaction for 20 minutes, dark-green doped PANI (solid) forms in the reaction solution. The reaction solution was then filtered to obtain the solid part, which was washed by distilled water, methanol and $HCl_{(aq)}$ solution until the filtrate became colorless. However, the as-prepared PANI doped with HCl has low conductivity. Thus, 0.1M ammonia water was added to dedope the PANI powder, and dried in vacuum. The dried powder (0.1 g) was dissolved in 0.1M PSS (20 mL, M.W.=75000) aqueous solution to obtain the desired doped PANI:PSS solution (see formula (13), wherein PANI:PSS=3:2).

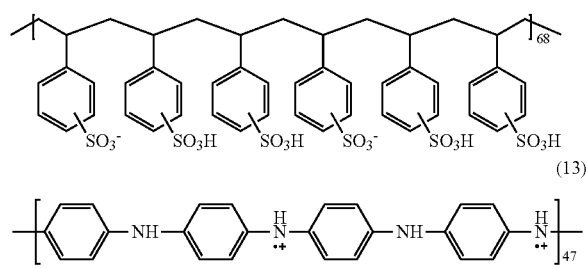

(13)

Fabrication and Treatment of PANI:PSS Film

The doped PANI:PSS solution (100 μL) was dropped on two glass plates (1×1 cm²), followed by heating to 100° C. to form PANI:PSS films. One of the PANI:PSS films was further treated with a drop of mixed solution (0.2 mL) containing 5 wt % HFIP and 95 wt % EG (wherein HFIP is used as the polar substance and EG is used as the polar solvent), then dried at 100° C. The sheet resistances of the two doped PANI:PSS films are shown in table 2. As shown in table 2, the conductivity of PANI:PSS film increases upon treating with the mixed solution.

TABLE 2

| PANI:PSS film | sheet resistance (ohm/sq) |
|---|---|
| Before treated by mixed solution | $2.2 \times 10^6$ |
| After treated by mixed solution | $0.3 \times 10^6$ |

EXAMPLE 3

PEDOT:PSS Film Applied to Dye-Sensitized Solar Cell (DSSC)

In this embodiment, the titanium dioxide ($TiO_2$) slurry was formed on a cleaned conductive glass (FTO) by screen printing, and heats in a tube furnace at 450° C. Thus, $TiO_2$ forms anatase crystalline phase and tightly attached on the surface of the FTO (fluorine-doped tin oxide) glass. Two layers of $TiO_2$ films with small $TiO_2$-particle and one layer of large-particle $TiO_2$ diffusing layer were deposited thereon in sequence to fabricate a $TiO_2$ electrode. The fabricated $TiO_2$ electrode was dipped in $3 \times 10^{-4}$ M N719 (cis-bis(isothiocyanato)bis-(2,2'-bipyridyl-4,4'-dicar-boxylato)-ruthenium(II)bis-tetrabutyl-ammonium) ethanol solution for 4 hrs, washed by alcohol and dried in a Petri dish. Two types of PEDOT:PSS solutions (No. 1 of table 1 and No. 18 of table 1) were dropped on two glass plates respectively, followed by heating and drying to form PEDOT:PSS counter electrode. The dye adsorbed $TiO_2$ electrode and the PEDOT:PSS counter electrode are sandwiched with a spacer (Surlyn®), and the electrolyte was injected through the hole on the counter electrode. The hole was quickly covered with a cover glass and sealed to make a Pt—, TCO free DSSC devices. The electrolyte used contains 0.6 M BMII (N-methyl-N-butyl-imidazolium iodide), 0.1M LiI, 0.05 M $I_2$, 0.5 M TBP (4-tert-butylpyridine), 0.1M GuNCS (guanidinium thiocyanate) dissolved in acetonitrile. Under the simulated solar light irradiation (AM 1.5, 100 mW/cm²), the current-voltage curve was measured to calculate the photoelectric conversion efficiency.

The results are shown in table 3. The data reveal that PEDOT:PSS film fabricated from the mixture of PEDOT:PSS, polar substance and polar solvent can be applied to DSSC to improve the conversion efficiency of Pt-TCO free devices.

TABLE 3

| doped conjugated polymer solution for fabricating counter electrode | Current density (mA/cm²) | voltage (V) | Fill factor | photo-electric conversion efficiency (%) | Sheet resistance (ohm/sq) |
|---|---|---|---|---|---|
| 1 wt % PEDOT:PSS aqueous solution | 7.94 | 0.60 | 0.18 | 0.84 | 439 |
| 1 wt % PEDOT:PSS + 84 wt % $H_2O$ + 10 wt % EG + 5 wt % HFIP | 13.63 | 0.48 | 0.35 | 2.28 | 1.81 |

EXAMPLE 4

PEDOT:PSS Film Applied to Polymer Multiple Junction Solar Cell

A cleaned ITO glass plate was prepared, and PEDOT:PSS was deposited thereon by spin coating for forming a hole transport layer. In this case, PEDOT:PSS solution as No. 1 and No. 18 listed in table 1 were used respectively to make a hole transport layer. An active layer containing PCBM ([6,6]-phenyl-C61-butyric acid methyl ester) and P3HT (poly(3-hexylthiophene)) was deposited thereon, and then calcium and aluminum was deposited, respectively by vacuum evaporating to be a cathode, a polymer multiple junction solar cell was assembled. The photovoltaic performance of the polymer multiple junction solar cells using PEDOT:PSS films formed by different conjugated polymer solutions (No. 1 and No. 18 of table 1) as the hole transport layers are listed in table 4.

The results show that polymer solar cell using the doped PEDOT:PSS film (fabricated from the solution containing polar substance (HFIP) and polar solvent (mixture of EG and water)) with high conductivity as a hole transport layer can improve the photovoltaic performance of the polymer solar cell.

TABLE 4

| doped conjugated polymer solution for fabricating electronic-hole transport layer | Current density (mA/cm$^2$) | voltage (V) | Fill factor | photo-electric conversion efficiency (%) |
|---|---|---|---|---|
| 1 wt % PEDOT:PSS aqueous solution | 8.82 | 0.60 | 0.64 | 3.42 |
| 1 wt % PEDOT:PSS + 84 wt % H$_2$O + 10 wt % EG + 5 wt % HFIP | 14.98 | 0.59 | 0.61 | 5.43 |

EXAMPLE 5

PEDOT:PSS Film Applied to Electrode

Figure 4:
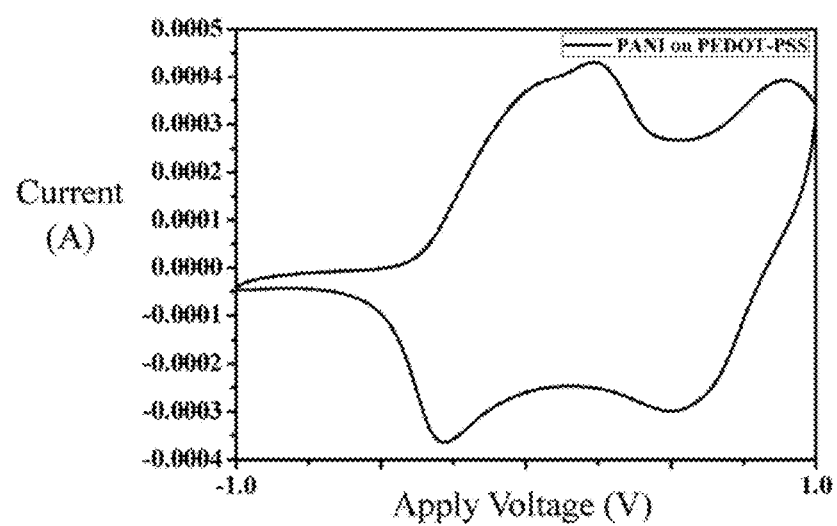
FIG. 4 is a cyclic voltammetry graph for polyaniline (PANT) when a doped conjugated polymer film (fabricated from a solution containing PEDOT:PSS, water, ethylene glycol and hexafluoroisopropanol) was used as a working electrode.

100 μl of PEDOT:PSS solution (No. 18 of table 1) was coated on a cleaned glass plate to form a PEDOT:PSS film which was used as a conductive electrode. Then, a layer of PANI film was coated on top of PEDOT:PSS film to make a working electrode. The electrochemical property of PANI film was measured by a cyclic voltammetry (CV) method. The CV was recorded with a three-electrode system, in which PANI coated PEDOT:PSS film was used as the working electrode, a reference electrode of Ag/Ag$^+$, and a counter electrode of platinum plate. The electrolyte is 0.1M LiClO$_4$/CH$_3$CN solution, and the scan rate is 100 mV/sec. The resulting CV diagrams are shown in FIG. 4. CV of PANI has similar cathodic and anodic currents, indicating that the PEDOT:PSS film with high conductivity of the present invention is suitable for using as an electrode.

In summary, the method for fabricating a doped conjugated polymer film is to use polymer solution to form the mixture of the doped conjugated polymer and polar substance in a polar solvent. The doped conjugated polymer film fabricated from the doped conjugated polymer solution mentioned above has lower sheet resistance as well as higher conductivity and thermal stability. In addition, the method for treating a doped conjugated polymer film to increases its conductivity of the present invention is to add a mixed solution to the doped conjugated polymer film. The resulting doped conjugated polymer film can be applied to the fields of solar cell, capacitor, light-emitting diode, pattern etching, ESD, flexible electrode, EMI shielding, and the likes.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for fabricating a doped conjugated polymer film, comprising the steps of:
    mixing a polar substance, a polar solvent and a doped conjugated polymer to form a doped conjugated polymer solution, wherein the polar substance is selected from the group consisting of formula (1), formula (2), inorganic acids, benzene-containing organic acids, or their combinations, and the polar solvent is selected from the group consisting of water, ethers, alcohols, sulfoxides, alcohol ethers, ketones, amines, nitriles, carboxylic acids, amides, or their combinations; and
    forming the doped conjugated polymer film with the doped conjugated polymer solution,
    wherein e of the formula (1) is an integral between 0 and 5, each of $R_1$ to $R_8$ of the formula (1) and $R_9$ to $R_{14}$ of the formula (2) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, and j is an integral between 0 and 8,
    wherein at least one of $R_1$ to $R_8$ of the formula (1) or $R_9$ to $R_{14}$ of the formula (2) comprises at least one halogen,
    wherein the doped conjugated polymer is selected from the group consisting of formulas (4) and (5), or their derivatives, copolymers, or combinations,
    wherein n of the formulas (4) and (5) is an integral between 3 and 5000, each of $R_1$ to $R_6$ of the formulas (4) and (5) is selected from the group consisting of hydrogen, fluorine, chlorine, bromine, iodine, amino, formyl, carboxyl, $OC_jH_{2j+1}$, $C_jH_{2j+1}$, $SC_jH_{2j+1}$, $N(C_jH_{2j+1})_2$, $C_jH_{2j+1}SO_3H$, or $C_jH_{2j}PO_3H_2$, j is an integral between 0 and 8, p of the formula (4) is an integral between 1 and 3, m of the formulas (4) and (5) is an integral between −5000 and 5000, a of the formulas (3) to (5) is an integral between 5000 and −5000, and $A^a$ of the formulas (4) and (5) is an organic cation, an organic anion, an inorganic cation, an inorganic anion, or an ionic polymer.

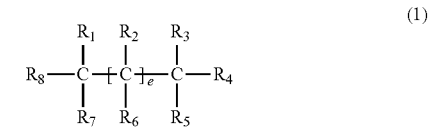

(1)

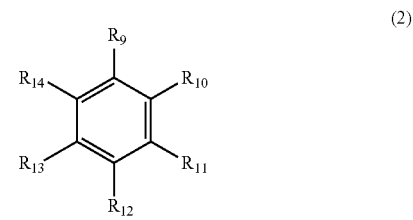

(2)

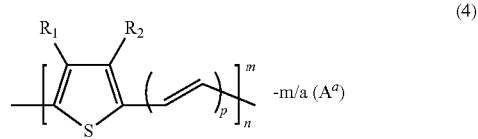

(4)

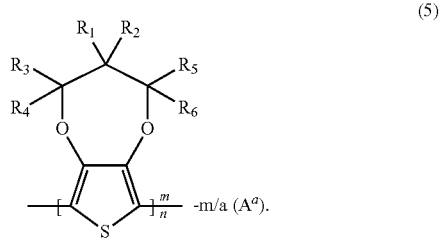

(5)

2. The method of claim 1, wherein the mixing step is to mix the polar solvent and the doped conjugated polymer, and then to add the polar substance.

3. The method of claim 1, wherein the concentration of the doped conjugated polymer is between 0.1 and 30 weight %.

4. The method of claim 1, wherein the concentration of the polar substance is between 0.001 and 50 weight %.

5. The method of claim 1, wherein the polar substance is selected from the group consisting of hexafluoroisopropanol, 1,1,1,3,3,3-hexafluoro-2-phenyl-2-propanol, 1,1,1,3,3,3-hexafluoro-2-(p-tolyl)-propanol, heptafluoroisopropyl iodide, tetrafluoropropanol, pentafluoropropanol, hexafluoropropanol, 1H,1H,3H-hexafluoro-2-butanol, nonafluorovaleric acid, perfluorohexenoic acid, hexafluoro benzene, perfluoropropane, sulfuric acid, hydrochloric acid, perchloric acid, nitric acid, benzoic acid, and their combinations.

6. The method of claim 1, wherein the polar solvent is selected from the group consisting of: water, ethyl ether, ethyl propyl ether, propyl ether, diisopropyl ether, dibutyl ether, methyl tert-butyl ether, ethylene glycol dimethyl ether, diethylene glycol dimethyl ether, benzyl methyl ether, isochroman, 2-phenylethylmethyl ether, n-butyl ethyl ether, 1,2-diethoxyethane, sec-butyl ether, isodibutyl ether, ethyl n-propyl ether, ethyl isopropyl ether, n-hexyl methyl ether, n-butyl methyl ether, methyl n-propyl ether, methanol, ethanol, ethylene glycol, 1-propanol, 2-propanol (isopropanol), glycerol, 1-butanol, 2-butanol, 2-methyl-1-propanol (isobutanol), 2-methyl-2-propanol (tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 3-hexanol, 2-hexanol, 4-methyl-2-pentanol, 2-methyl-1-butanol, 2,2-dimethyl-1-propanol, 3-hexanol, 2-hexanol, 4-methyl-2-pentanol, 2-methyl-1-pentanol, 2-ethyl butanol, 2,4-dimethyl-3-pentanol, 1-heptanol, 2-heptanol, 3-heptanol, 4-heptanol, 2-ethyl-1-hexanol, 2,6-dimethyl-4-heptanol, 2-dimethyl cyclohexanol, 3-dimethyl cyclohexanol, 4-dimethyl cyclohexanol, 2-butoxyethanol, 1-methoxy-2-propanol, 2-methoxyethanol, 2-ethoxyethanol, 1-methoxy-2-butanol, ethylene glycol monopropyl ether, 1-ethoxy-2-propanol, 3-methoxy-1-butanol, ethylene glycol monoisobutyl ether, ethylene glycol mono-n-butyl ether, 3-methoxy-3-methyl butanol, ethylene glycol mono-tert-butyl ether, acetone, methyl ethyl ketone, methyl isobutyl ketone, cyclohexanone, isopropyl ketone, 2-pentanone, 3-pentanone, 3-hexanone, diisopropanone, 2-dihexanone, cyclopentanone, 4-heptanone, isoamyl ketone, 3-heptanone, 2-heptanone, 4-methoxy-4-methyl-2-pentanone, 5-methyl-3-heptanone, 2-methyl cyclohexanone, diisobutyl ketone, 5-methyl-2-octanone, 3-methyl cyclohexanone, 2-cyclohexene-1-one, 4-methyl cyclohexanone, cycloheptanone, 4-tert-butyl cyclohexanone, isophorone, benzylacetone, acetonitrile, acrylonitrile, trichloroacetonitrile, propionitrile, neo-pentanenitrile, isobutyronitrile, n-butyronitrile, methoxyacetonitrile, 2-methylbutyronitrile, isopentanenitrile, n-pentanenitrile, n-hexanenitrile, 3-methoxypropionitrile, 3-ethoxypropionitrile, 3,3-oxydipropionitrile, n-heptanenitrile, glycolonitrile, benzonitrile, ethylene cyanohydrin, butanedinitrile, acetone cyanohydrin, 3-n-butoxypropionitrile, dimethyl sulfoxide, dibutyl sulfoxide, methyl phenyl sulfoxide, dimethylformamide, dimethylacetamide, acrylamide, 2-acetamidoethanol, N,N-dimethyl-n-benzylformamide, trifluoroacetamide, N,N-dimethylformamide, N,N-diethyl lauroylamide, ε-caprolactam, N,N-dimethyl ethylamide, N-tert-butylformamide, formamide, neo-pentanamide, N-butyramide, N,N-dimethylacetylacetamide, N-methylformamide, N,N-diethylformamide, N-carbonylethylamine, acetamine, N,N-diisopropylformamine, 1-formylpiperidine, N-methyl-N-formylaniline, monoalkylamine, dialkylamine, trialkylamine, cycloamine, aromatic amine, $C_6$ carboxylic acid, and their combinations.

* * * * *